United States Patent
Acar et al.

(10) Patent No.: US 10,393,770 B2
(45) Date of Patent: Aug. 27, 2019

(54) MULTI-AXIS ACCELEROMETER WITH REDUCED STRESS SENSITIVITY

(71) Applicant: SEMICONDUCTOR COMPONENTS INDUSTRIES, LLC, Phoenix, AZ (US)

(72) Inventors: Cenk Acar, Santa Clara, CA (US); Brenton Simon, Fremont, CA (US); Sandipan Maity, San Carlos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 160 days.

(21) Appl. No.: 15/487,294

(22) Filed: Apr. 13, 2017

(65) Prior Publication Data
US 2017/0315147 A1    Nov. 2, 2017

Related U.S. Application Data

(60) Provisional application No. 62/328,981, filed on Apr. 28, 2016.

(51) Int. Cl.
| | |
|---|---|
| *G01P 15/18* | (2013.01) |
| *G01P 15/125* | (2006.01) |
| *G01P 15/135* | (2006.01) |
| *G01P 15/08* | (2006.01) |

(52) U.S. Cl.
CPC .......... *G01P 15/135* (2013.01); *G01P 15/125* (2013.01); *G01P 15/18* (2013.01); *B81B 2203/0181* (2013.01); *G01P 2015/0831* (2013.01)

(58) Field of Classification Search
CPC ........ G01P 15/125; G01P 15/18; G01P 1/023; G01P 1/02
See application file for complete search history.

(56) References Cited

U.S. PATENT DOCUMENTS

| | | | | |
|---|---|---|---|---|
| 5,488,864 | A * | 2/1996 | Stephan | G01P 15/125 73/514.32 |
| 8,978,475 | B2 | 3/2015 | Acar | |
| 9,062,972 | B2 | 6/2015 | Acar et al. | |
| 9,455,354 | B2 | 9/2016 | Acar | |
| 2006/0277997 | A1* | 12/2006 | Foster | G01P 15/125 73/514.32 |
| 2008/0314147 | A1* | 12/2008 | Nasiri | G01P 15/125 73/514.32 |

(Continued)

*Primary Examiner* — Helen C Kwok
(74) *Attorney, Agent, or Firm* — IPTechLaw

(57) ABSTRACT

Implementations of an accelerometer component may include: a first Z proof mass rotatable about a first axis and coupled to an anchor, the first Z proof mass including a first plurality of electrodes. Implementations may include a second Z proof mass rotatable about the first axis and coupled to the anchor, the second Z proof mass including a second plurality of electrodes. An X-axis accelerometer subcomponent may be located within a perimeter of the first Z proof mass, and a Y-axis accelerometer subcomponent may be located within a perimeter of the second Z proof mass. The first plurality of electrodes and the second plurality of electrodes may be symmetrical about each of the first axis, a second axis perpendicular to the first axis, a third axis diagonal to the first axis and second axis, and a fourth axis diagonal to the first axis and second axis.

16 Claims, 4 Drawing Sheets

(56) References Cited

U.S. PATENT DOCUMENTS

| | | | | |
|---|---|---|---|---|
| 2010/0024554 A1* | 2/2010 | Classen | ................. | G01P 15/125 |
| | | | | 73/514.32 |
| 2010/0107763 A1* | 5/2010 | Lin | ....................... | G01P 15/125 |
| | | | | 73/514.32 |
| 2010/0122579 A1* | 5/2010 | Hsu | ...................... | G01P 15/125 |
| | | | | 73/514.32 |
| 2010/0300204 A1* | 12/2010 | Reinmuth | ............. | G01P 15/125 |
| | | | | 73/514.32 |
| 2011/0154899 A1* | 6/2011 | Classen | ................. | G01P 15/125 |
| | | | | 73/514.32 |
| 2012/0000287 A1* | 1/2012 | Frangi | ................... | G01P 15/125 |
| | | | | 73/514.32 |
| 2012/0017681 A1* | 1/2012 | Reinmuth | ............. | G01P 15/125 |
| | | | | 73/514.35 |
| 2013/0042686 A1* | 2/2013 | Lin | ....................... | G01P 15/125 |
| | | | | 73/514.32 |
| 2013/0104654 A1* | 5/2013 | Classen | ................. | G01P 15/125 |
| | | | | 73/514.16 |
| 2013/0192371 A1* | 8/2013 | Rytkonen | ................ | G01P 15/02 |
| | | | | 73/514.32 |
| 2014/0144235 A1* | 5/2014 | Suzuki | ................. | G01P 15/125 |
| | | | | 73/514.32 |
| 2015/0268269 A1* | 9/2015 | Jia | ......................... | G01P 15/125 |
| | | | | 73/514.32 |
| 2016/0097792 A1* | 4/2016 | Naumann | ............... | G01P 15/18 |
| | | | | 73/504.02 |
| 2018/0238925 A1* | 8/2018 | Acar | ....................... | G01P 1/023 |

\* cited by examiner

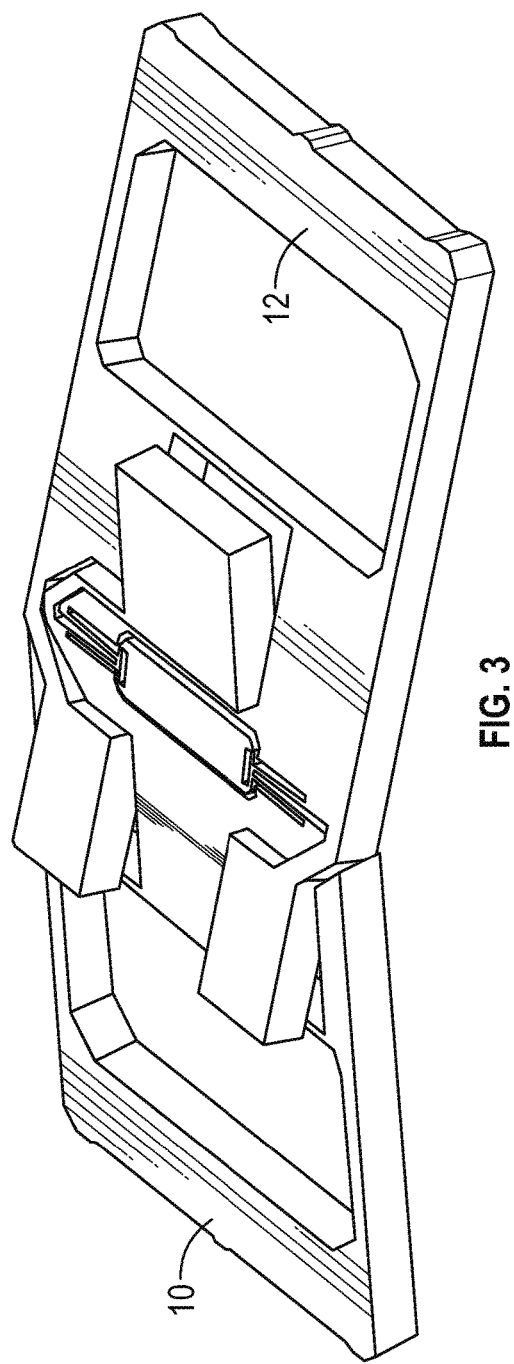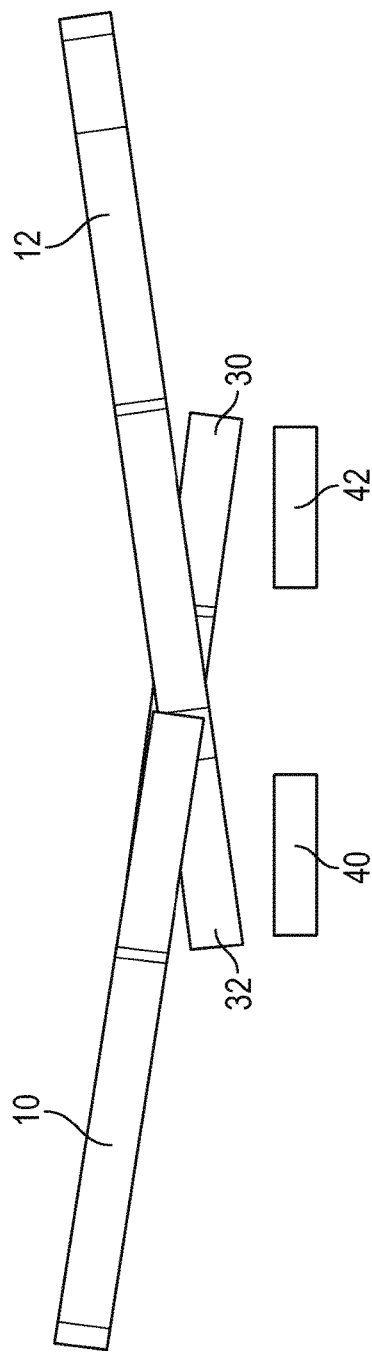

MULTI-AXIS ACCELEROMETER WITH REDUCED STRESS SENSITIVITY

CROSS REFERENCE TO RELATED APPLICATIONS

This document claims the benefit of the filing date of U.S. Provisional Patent Application 62/328,981, entitled "Micromachined Multi-Axis Accelerometer with Reduced Stress Sensitivity" to Acar et al., which was filed on Apr. 28, 2016, the disclosure of which is hereby incorporated entirely herein by reference.

BACKGROUND

1. Technical Field

Aspects of this document relate generally to accelerometers. More specific implementations involve multi-axis microelectromechanical system (MEMS) accelerometers.

2. Background

Accelerometers have conventionally been used to measure acceleration in a given direction. MEMS accelerometers have been developed in order to decrease the size of the accelerometers so that they can be used in smaller devices, such as, by non-limiting example, mobile phones, personal digital assistants, portable media players, cameras, and wearable electronics.

SUMMARY

Implementations of an accelerometer component may include: a first Z proof mass rotatable about a first axis and coupled to an anchor, the first Z proof mass including a first plurality of electrodes, a second Z proof mass rotatable about the first axis and coupled to the anchor, the second Z proof mass including a second plurality of electrodes, an X-axis accelerometer subcomponent located within a perimeter of the first Z proof mass, and a Y-axis accelerometer subcomponent located within a perimeter of the second Z proof mass, wherein the first plurality of electrodes and the second plurality of electrodes are symmetrical about each of the first axis, a second axis perpendicular to the first axis, a third axis diagonal to the first axis and second axis, and a fourth axis diagonal to the first axis and second axis.

Implementations of accelerometer components may include one, all, or any of the following:

The X-axis accelerometer subcomponent may not be directly mechanically coupled with the first Z proof mass.

The Y-axis accelerometer subcomponent may not be directly mechanically coupled with the second Z proof mass.

Each electrode of the first plurality of electrodes may be larger in size than each electrode of the second plurality of electrodes.

The first plurality of electrodes of the first Z proof mass may include two electrodes.

The second plurality of electrodes of the second Z proof mass may include four electrodes.

The first Z proof mass and the second Z proof mass may rotate in opposite directions with respect to each other when accelerating.

The X-axis accelerometer subcomponent may include two electrode anchors located symmetrically with respect to each other on either side of an X proof mass anchor.

The Y-axis accelerometer subcomponent may include two electrode anchors located symmetrically with respect to each other on either side of a Y proof mass anchor.

Implementations of an accelerometer component may include a first Z proof mass rotatable about a first axis and coupled to an anchor, the first Z proof mass including a first pair of electrodes and a second Z proof mass rotatable about the first axis and coupled to the anchor, the second Z proof mass including a second pair of electrodes and a third pair of electrodes. An X-axis accelerometer subcomponent or a Y-axis accelerometer subcomponent may be located within a perimeter of the first Z proof mass. An X-axis accelerometer subcomponent or a Y-axis accelerometer subcomponent may be located within a perimeter of the second Z proof mass. The X-axis accelerometer subcomponent may include two electrode anchors located symmetrically with respect to each other on either side of an X proof mass anchor. The Y-axis accelerometer subcomponent may include two electrode anchors located symmetrically with respect to each other on either side of a Y proof mass anchor. Each pair of electrodes may be positioned so that each electrode pair is located symmetrically about one of the first axis, a second axis perpendicular to the first axis, a third axis diagonal to the first axis and second axis, and a fourth axis diagonal to the first axis and second axis.

Implementations of accelerometer components may include one, all, or any of the following:

The first pair of electrodes may be between the second pair of electrodes and the third pair of electrodes.

The X-axis accelerometer subcomponent may not be directly mechanically coupled with the first Z proof mass.

The Y axis accelerometer subcomponent may not be directly mechanically coupled with the second Z proof mass.

Implementations of an accelerometer component may include a first proof mass rotatable about a first axis and coupled to an anchor, the first proof mass including a first pair of electrodes. A second proof mass may be included rotatable about the first axis and coupled to the anchor, the second proof mass including a second pair of electrodes and a third pair of electrodes. The first proof mass and the second proof mass may be each rotatable about the anchor, and where each pair of electrodes is positioned so the accelerometer component is symmetrical about each of the first axis, a second axis perpendicular to the first axis, a third axis diagonal to the first axis and second axis, and a fourth axis diagonal to the first axis and second axis.

Implementations of accelerometer components may include one, all, or any of the following:

An X-axis accelerometer subcomponent may be located within a perimeter of the first Z proof mass.

A Y-axis accelerometer subcomponent may be located within a perimeter of the second Z proof mass.

The first pair of electrodes may be between the second pair of electrodes and the third pair of electrodes.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 3 is a perspective view of a Z-axis accelerometer subcomponent with Z portion masses rotating in a second direction FIG. 4; is a side view of the Z-axis accelerometer subcomponent illustrated in FIG. 2;

DESCRIPTION

This disclosure, its aspects and implementations, are not limited to the specific components, assembly procedures or method elements disclosed herein. Many additional components, assembly procedures and/or method elements known in the art consistent with the intended accelerometer components will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such accelerometer components, and implementing components and methods, consistent with the intended operation and methods.

Implementations of accelerometer components disclosed herein may utilize the principles disclosed in Chapter 19, "A Capacitative Accelerometer" of the textbook *Microsystern Design* by Stephen D. Senturia and published by Kluwer Academic Publishers (2001), the disclosure of which is hereby entirely incorporated by reference.

In various implementations, accelerometer components or pieces of the accelerometer components disclosed in this document may be symmetrical. As used herein, when the term "symmetry" or "symmetrical" is used in this disclosure, it may refer to, by non-limiting example, reflectional symmetry, rotational symmetry, translational symmetry, diagonal symmetry, or any other recognized form of symmetry.

Figure 1:
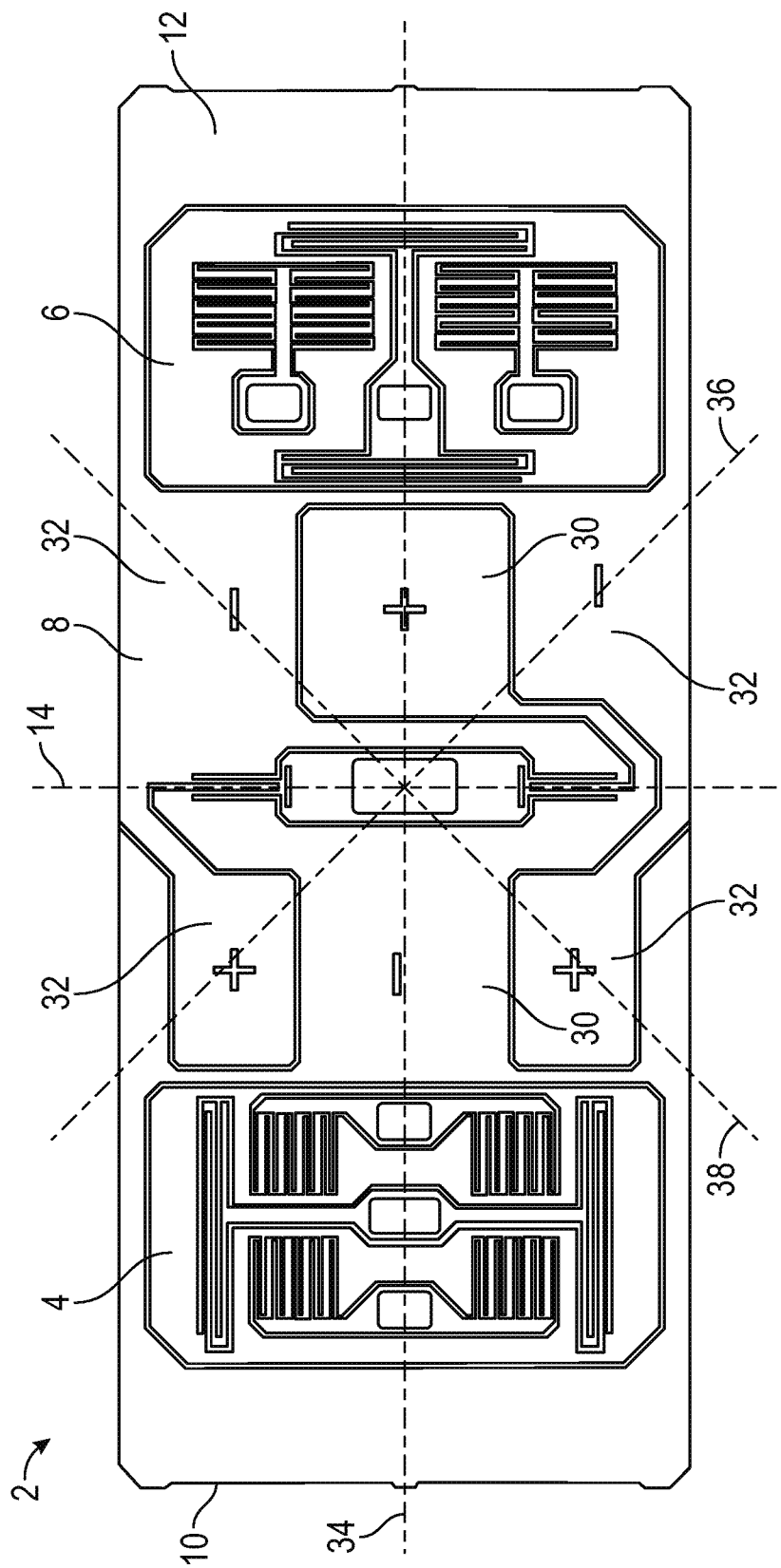
FIG. 1 is a top schematic view of an accelerometer component.

Referring now to FIG. 1, a top schematic view of an accelerometer component implementation is illustrated. The accelerometer component 2 may be a microelectromechanical system (MEMS) accelerometer component. The accelerometer component 2 may include one or more accelerometer subcomponents used to measure acceleration in one or more different axes. The accelerometer component may include an X-axis accelerometer subcomponent 4, a Y-axis accelerometer subcomponent 6, and a Z-axis accelerometer subcomponent 8. In implementations including a Z-axis accelerometer subcomponent, the Z-axis accelerometer subcomponent may include a first Z proof mass 10 and a second Z proof mass 12 rotatable about a first axis 14. The X-axis accelerometer subcomponent and the Y-axis accelerometer subcomponent may be located within a perimeter of the Z-axis accelerometer subcomponent. In such implementations, the accelerometer component has an overall decreased size relative to those accelerometer components where the X- and Y-axis accelerometer subcomponents are located outside the shape of the Z-axis accelerometer. Because of the presence of the three axes in the accelerometer component, acceleration in any axis can be detected by a sensor that includes the component.

In various implementations, the X-axis, Y-axis, and Z-axis may indicate axes along the traditional and common place X-axis, Y-axis, and Z-axis, while in other implementations, the X-axis, Y-axis, and Z-axis may indicate axes that do not conform to the traditional and common place X-axis, Y-axis, and Z-axis. This situation arises when the accelerometer is not aligned in a use condition with one or more of the common place axes.

Figure 2:
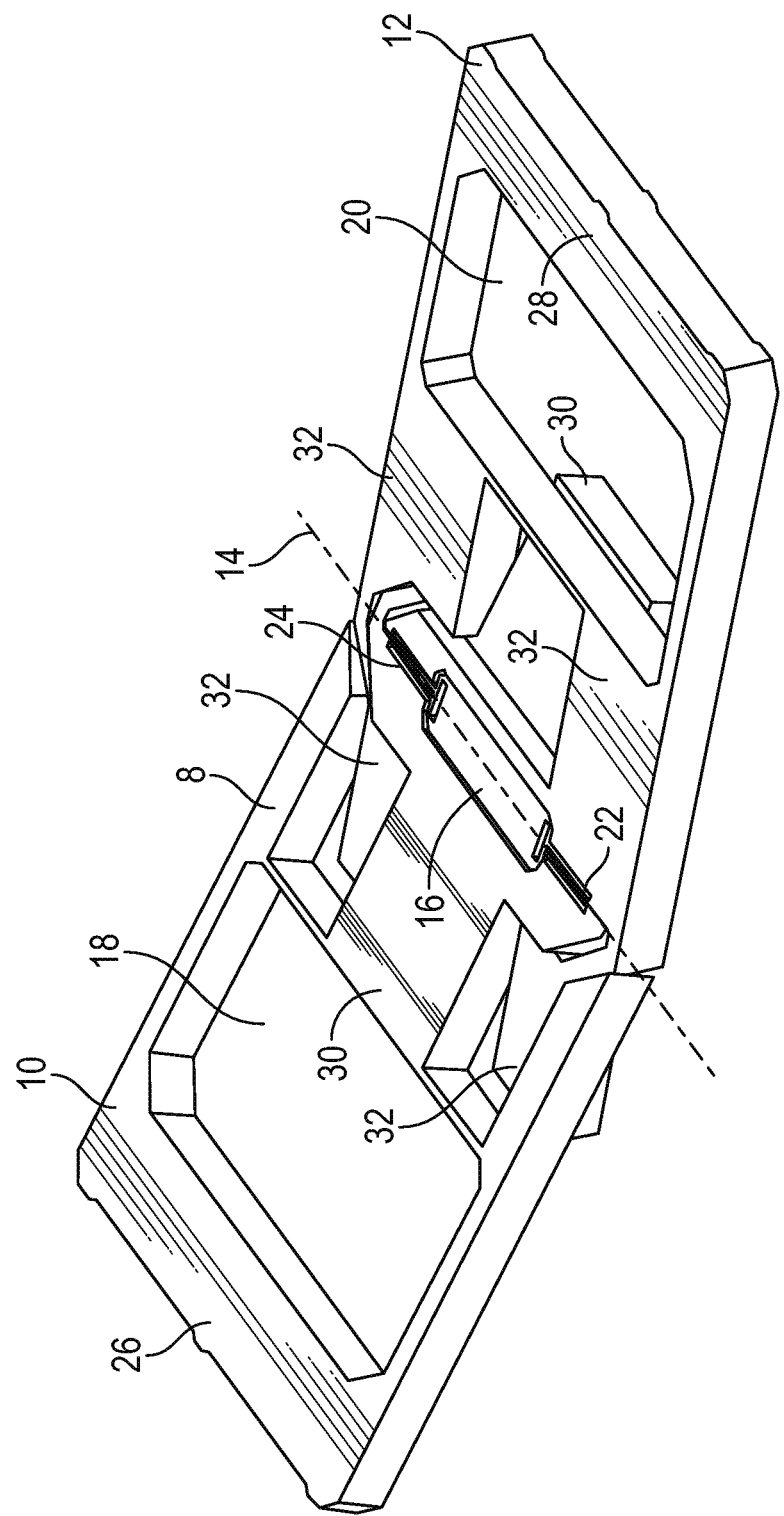
FIG. 2 is a perspective view of a Z-axis accelerometer subcomponent with Z portion masses rotating in a first direction.

Referring now to FIG. 2, a perspective view of a Z-axis accelerometer subcomponent with Z portion masses rotating in a first direction is illustrated. The Z-axis accelerometer subcomponent may include an anchor 16 and the first Z proof mass 10 and the second Z proof mass 12 may be rotatably coupled to the anchor 16. The anchor 16 may be aligned with the first axis 14.

The first Z proof mass 10 may include a hole/opening 18 therethrough. The hole 18 may be of varying shapes and sizes and may be configured to have other accelerometer components fit within its perimeter.

The second Z proof 12 mass may include a hole 20 therethrough. The hole 20 may be of varying shapes and sizes and may be configured, in various implementations, to have other accelerometer components fit within its perimeter.

As illustrated, the first Z proof mass 10 may be coupled to the anchor 16 through a first suspension bridge 22 and a second suspension bridge 24. The second Z proof mass 12 may be coupled to the anchor 16 through the first suspension bridge 22 and the second suspension bridge 24. The first suspension bridge 22 may include two different suspensions, one used to couple the anchor 16 to the first Z proof mass 10 and the other used to couple the anchor 16 to the second Z proof mass 12. Similarly, the second suspension bridge 24 may include two different suspensions, one used to couple the anchor 16 to the first Z proof mass 10 and the other used to couple the anchor 16 to the second Z proof mass 12.

The first Z proof mass 10 and the second Z proof mass 12 may rotate in opposite directions about the anchor 16 with respect to one another when accelerating. FIG. 2 illustrates an implementation where an upward acceleration has been applied to the Z-axis accelerometer subcomponent. In the example illustrated by FIG. 2, the first Z proof mass 10 rotates clockwise and the second Z proof mass 12 rotates counterclockwise about the anchor 16. Alternative to this, FIG. 3 illustrates a perspective view of a Z-axis accelerometer subcomponent with Z portion masses rotating in a second direction opposite the first. FIG. 3 illustrates an implementation where a downward acceleration has been applied to the Z-axis accelerometer subcomponent. In the example illustrated by FIG. 4, the first Z proof mass 10 rotates counter-clockwise and the second Z proof mass 12 rotates clockwise about the anchor 16.

The first Z proof mass 10 may include a high inertial-moment area 26. The high inertial moment area 26 may be located at a large radial distance from the center in order to provide a maximum inertial torque when an acceleration is applied to the Z-axis accelerometer subcomponent. In various implementations, the high inertial-moment area 26 may be located closer to the anchor 16. In this way, the sensitivity of the accelerometer component in the Z axis may be made as high as possible.

The second Z proof mass 12 may include a high inertial-moment area 28. Like for the first Z proof mass, the high inertial moment area 28 may be located at a large radius from the center in order to provide a maximum inertial torque when an acceleration is applied to the accelerometer component. In various implementations, the high inertial-moment area 28 may be located closer to the anchor 16.

In various implementations, the high inertial-moment area 28 may be the same size and mass as the high inertial-moment area 26. Further, the high inertial-moment area 28 may be located on the second Z proof mass 12 in the same position that the high inertial-moment area 26 is located on the first Z proof mass 10. In such implementations, the high inertial-moment areas may be symmetrical.

The first Z proof mass 10 may include a first plurality of electrodes 30. The first plurality of electrodes 30 may be differential electrodes and may be located symmetrically about the anchor 16. In the implementation illustrated by FIG. 2, the first Z proof mass includes two differential electrodes, or a pair of electrodes, located symmetrically across the first axis 14. In other implementations, the first Z proof mass may include 4, 6, 8 or any other number of electrodes or pairs of electrodes.

The second Z proof mass 12 may include a second plurality of electrodes 32. The second plurality of electrodes 32 may be differential electrodes and may be located symmetrically about the anchor 16. In the implementation illustrated by FIG. 2, the second Z proof mass 12 includes four differential electrodes, or a second and third pair of electrodes, located symmetrically across the first axis 16. In other implementations, the second Z proof mass may include 2, 6, 8 or any other number of electrodes or pairs of electrodes.

In the implementation illustrated by FIG. 2, the first plurality of electrodes 30 may be positioned between the second plurality of electrodes 32. In implementations where the first plurality of electrodes 30 includes fewer electrodes than the second plurality of electrodes 32, the electrodes of the first plurality of electrodes 30 may be larger in size than the electrodes of the second plurality of electrodes 32. In the implementation illustrated by FIG. 2, the first plurality of electrodes 30 is twice as large as the second plurality of electrodes 32 in order to maintain the symmetry of the electrodes.

Referring now to FIG. 4, a side view of the Z-axis accelerometer subcomponent illustrated in FIG. 2 is illustrated. A first plurality of sensors 40 and a second plurality of sensors 42 may be positioned below the first plurality of electrodes 30 and the second plurality of electrodes 32. The first plurality of sensors 40 may include two smaller sensors positioned under two electrodes of the second plurality of electrodes 32. The first plurality of sensors 40 may also include a larger sensor positioned under a larger electrode of the first plurality of electrodes 30. The second plurality of sensors 42 may include two smaller sensors positioned under two electrodes of the second plurality of electrodes 32. The second plurality of sensors 42 may also include a larger sensor positioned under a larger electrode of the first plurality of electrodes 30. In various implementations, the first plurality of sensors 40 and the second plurality of sensors 42 will together include as many sensors as the Z proof masses have electrodes. Further, the sensors may correspond in position and size to the first plurality of electrodes 30 and the second plurality of electrodes 32.

As the first Z proof mass 10 and the second Z proof mass 12 move due to acceleration of the accelerometer component, the first plurality of sensors 40 and the second plurality of sensors 42 may detect acceleration through the change in capacitance detected by the movement of the first plurality of electrodes 30 and the second plurality of electrodes 32. In the implementation illustrated by FIG. 4 and FIG. 2, the differential capacitance measured is negative. In the implantation illustrated by FIG. 3, the differential capacitance measured is positive. In this way, by measuring the differential capacitance between the first plurality of electrodes 30 with the first plurality of sensors 40 and the second plurality of sensors 42 and the change in capacitance between the second plurality of electrodes 32 with the first plurality of sensors 40 and the second plurality of sensors 42, the acceleration of the accelerometer can be determined.

Referring back to FIG. 1, the symmetry of the first plurality of electrodes 30 and the second plurality of electrodes 32 is illustrated. The first plurality of electrodes 30 and the second plurality of electrodes 32 may be located symmetrically about a first axis 14, a second axis 34, a third axis 36 diagonal to the first axis and the second axis, and a fourth axis 38 diagonal to the first axis 14 and the second axis 34. By having the first plurality of electrodes 30 and the second plurality of electrodes 36 located symmetrically about the different axes, the accelerometer component may cancel deformations due to various stresses, such as packaging or those induced by changes in temperature, which can cause asymmetries about the different axes.

The accelerometer component 2 may include an X-axis accelerometer subcomponent 4. In various implementations, the X-axis accelerometer subcomponent 4 may not be directly mechanically coupled to the Z-axis accelerometer subcomponent 8. The accelerometer component may also include a Y-axis accelerometer subcomponent 6. In various implementations, the Y-axis accelerometer component 6 may not be directly mechanically coupled to the Z-axis accelerometer subcomponent 8.

Figure 5:
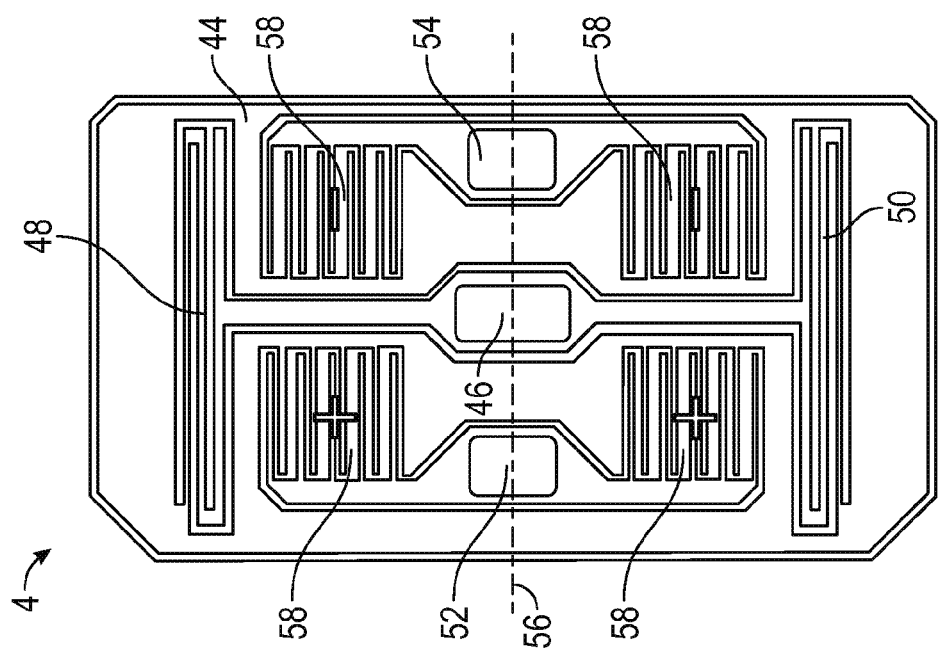
FIG. 5 is a top schematic view of an X-axis accelerometer subcomponent.

Referring specifically to FIG. 5, a top schematic view of an X-axis accelerometer subcomponent is illustrated. In various implementations the X-axis accelerometer subcomponent 4 may be located within a perimeter of the first Z proof mass. In other implementations, the X-axis accelerometer component may be located within a perimeter of the second Z proof mass. The X-axis accelerometer subcomponent may include a proof mass 44. The proof mass 44 may be coupled to an X proof mass anchor 46 through a first suspension beam 48 and a second suspension beam 50. The first and second suspension beams may be located on two opposing sides of the proof mass 44.

The X-axis accelerometer subcomponent may include a plurality of differential electrodes 58. The electrodes may differentiate along the Y-axis. The X-axis accelerometer subcomponent may include a first in-plane electrode anchor 52 and a second in-plane electrode anchor 54 located symmetrically with respect to each other on either side of the X proof mass anchor 46 and located symmetrically along a Y-axis 56. The symmetry of the in-plane electrode anchors may enhance the cancellation of asymmetric deformation of the electrodes. The gaps between the differential electrodes can be reversed so that the capacitance change occurs in opposite directions.

Figure 6:
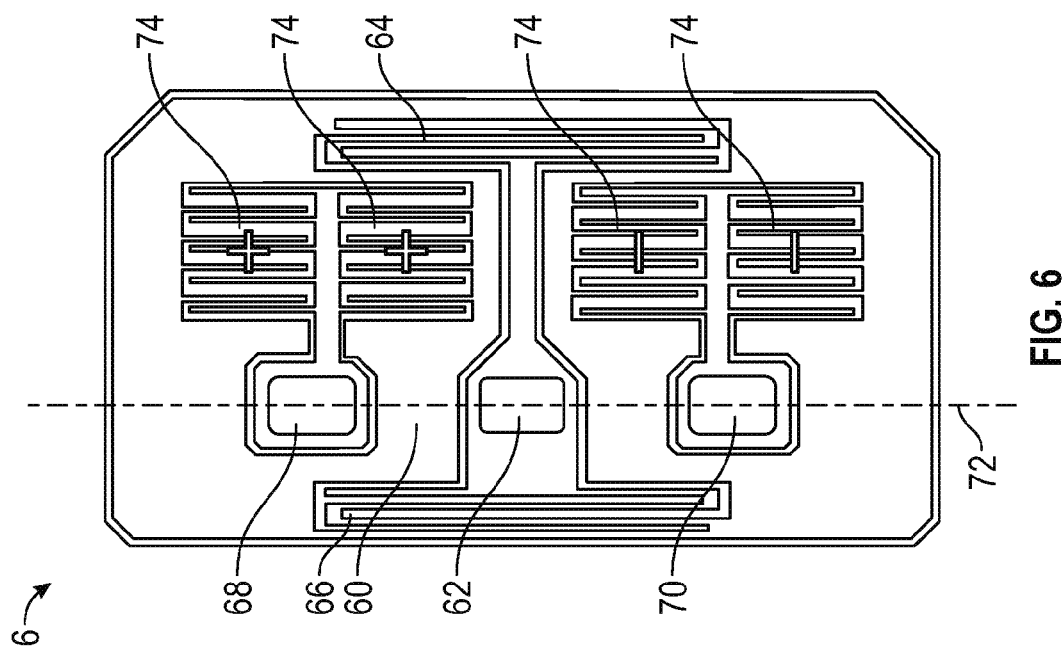
FIG. 6 is a top schematic view of Y-axis accelerometer subcomponent.

Referring specifically to FIG. 6, a top schematic view of a Y-axis accelerometer subcomponent is illustrated. In various implementations the Y-axis accelerometer subcomponent 6 may be located within a perimeter of the second Z proof mass. In other implementations, the Y-axis accelerometer subcomponent 6 may be located within a perimeter of the first Z proof mass. The Y-axis accelerometer subcomponent may include a proof mass 60. The proof mass 60 may be coupled to a Y proof mass anchor 62 through a first suspension beam 64 and a second suspension beam 66. The first and second suspension beams may be located on two opposing sides of the proof mass 60.

The Y-axis accelerometer may include a plurality of differential electrodes 74 along the X-axis. The Y-axis accelerometer may include a first in-plane electrode anchor 68 and a second in-plane electrode anchor 70 located symmetrically with respect to each other on either side of the Y proof mass anchor 62 and located symmetrically along an X-axis 72. The symmetry of the in-plane electrode anchors may enhance the cancellation of asymmetric deformation of the electrodes. The gaps between the differential electrodes can be reversed so that the capacitance change occurs in opposite directions.

While the X-axis and Y-axis accelerometers illustrated in this document are interdigital capacitive sensing accelerometers, other types of accelerometers could be used in various implementations and located within the perimeter of the Z proof masses as disclosed in this document. Such accelerometers may include, by non-limiting example, parallel plate designs, interdigital with fixed electrode designs, fringing designs, or any other capacitative sensing accelerometer type.

In places where the description above refers to particular implementations of accelerometer components and implementing components, sub-components, methods and sub-methods, it should be readily apparent that a number of modifications may be made without departing from the spirit thereof and that these implementations, implementing components, sub-components, methods and sub-methods may be applied to other accelerometer components.

What is claimed is:

1. An accelerometer component comprising:
   a first Z proof mass rotatable about a first axis and coupled to an anchor, the first Z proof mass comprising a first plurality of electrodes;
   a second Z proof mass independently rotatable about the first axis from the first Z proof mass and coupled to the anchor, the second Z proof mass comprising a second plurality of electrodes;
   an X-axis accelerometer subcomponent located within a perimeter of the first Z proof mass; and
   a Y-axis accelerometer subcomponent located within a perimeter of the second Z proof mass;
   wherein the first plurality of electrodes and the second plurality of electrodes are symmetrical about each of the first axis, a second axis perpendicular to the first axis, a third axis diagonal to the first axis and second axis, and a fourth axis diagonal to the first axis and second axis.

2. The component of claim 1, wherein the X-axis accelerometer subcomponent is not directly mechanically coupled with the first Z proof mass.

3. The component of claim 1, wherein the Y-axis accelerometer subcomponent is not directly mechanically coupled with the second Z proof mass.

4. The component of claim 1, wherein each electrode of the first plurality of electrodes is larger in size than each electrode of the second plurality of electrodes.

5. The component of claim 1, wherein the first plurality of electrodes of the first Z proof mass comprises two electrodes.

6. The component of claim 1, wherein the second plurality of electrodes of the second Z proof mass comprises four electrodes.

7. The component of claim 1, wherein the first Z proof mass and the second Z proof mass rotate in opposite directions with respect to each other when accelerating.

8. The component of claim 1, wherein the X-axis accelerometer subcomponent comprises two electrode anchors located symmetrically with respect to each other on either side of an X proof mass anchor.

9. The component of claim 1, wherein the Y-axis accelerometer subcomponent comprises two electrode anchors located symmetrically with respect to each other on either side of a Y proof mass anchor.

10. An accelerometer component comprising:
    a first Z proof mass rotatable about a first axis and coupled to an anchor, the first Z proof mass comprising a first pair of electrodes;
    a second Z proof mass independently rotatable about the first axis from the first Z proof mass and coupled to the anchor, the second proof mass comprising a second pair of electrodes and a third pair of electrodes,
    one of an X-axis accelerometer subcomponent or a Y-axis accelerometer subcomponent located within a perimeter of the first Z proof mass; and
    one of an X-axis accelerometer subcomponent or a Y-axis accelerometer subcomponent located within a perimeter of the second Z proof mass;
    wherein the X-axis accelerometer subcomponent comprises two electrode anchors located symmetrically with respect to each other on either side of an X proof mass anchor;
    wherein the Y-axis accelerometer subcomponent comprises two electrode anchors located symmetrically with respect to each other on either side of a Y proof mass anchor; and
    wherein each pair of electrodes is positioned so that each electrode pair is located symmetrically about one of the first axis, a second axis perpendicular to the first axis, a third axis diagonal to the first axis and second axis, or a fourth axis diagonal to the first axis and second axis.

11. The component of claim 10, wherein the first pair of electrodes is between the second pair of electrodes and the third pair of electrodes.

12. The component of claim 10, wherein the X-axis accelerometer subcomponent is not directly mechanically coupled with the first Z proof mass.

13. The component of claim 10, wherein the Y-axis accelerometer subcomponent is not directly mechanically coupled with the second Z proof mass.

14. An accelerometer component comprising:
    a first Z proof mass rotatable about a first axis and coupled to an anchor, the first proof mass comprising a first pair of electrodes;
    a second Z proof mass independently rotatable about the first axis from the first Z proof mass and coupled to the anchor, the second proof mass comprising a second pair of electrodes and a third pair of electrodes; and
    an X-axis accelerometer component located within a perimeter of the first Z proof mass;
    wherein the first Z proof mass and the second Z proof mass are each rotatable about the anchor; and
    wherein each pair of electrodes is positioned so the X-axis accelerometer component is symmetrical about each of the first axis, a second axis perpendicular to the first axis, a third axis diagonal to the first axis and second axis, and a fourth axis diagonal to the first axis and second axis.

15. The component of claim 14, further comprising a Y-axis accelerometer component located within a perimeter of the second Z proof mass.

16. The component of claim 15, wherein the first pair of electrodes is between the second pair of electrodes and the third pair of electrodes.

* * * * *